(12) United States Patent
Lin et al.

(10) Patent No.: US 7,553,689 B2
(45) Date of Patent: Jun. 30, 2009

(54) SEMICONDUCTOR DEVICE WITH MICRO-LENS AND METHOD OF MAKING THE SAME

(75) Inventors: Jeng-Shyan Lin, Tainan (TW); Chien-Hsien Tseng, Hsin chu (TW); Shou-Gwo Wuu, Hsin-chu (TW); Ho-Ching Chien, Hsinchu (TW); Dun-Nian Yaung, Taipei (TW); Hung-Jen Hsu, Tauo Yaun (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 330 days.

(21) Appl. No.: 11/181,189

(22) Filed: Jul. 13, 2005

(65) Prior Publication Data

US 2007/0015305 A1 Jan. 18, 2007

(51) Int. Cl.
 *H01L 21/00* (2006.01)
(52) U.S. Cl. .................................. 438/70; 257/E21.533
(58) Field of Classification Search .......... 257/E31.127, 257/E21.533; 438/69, 70, 71
 See application file for complete search history.

(56) References Cited

U.S. PATENT DOCUMENTS

| 5,323,052 | A  |   | 6/1994  | Koyama              |
|-----------|----|---|---------|---------------------|
| 5,796,154 | A  | * | 8/1998  | Sano et al. ... 257/432 |
| 6,030,852 | A  | * | 2/2000  | Sano et al. ... 438/69 |
| 6,066,511 | A  | * | 5/2000  | Fukusyo ... 438/60 |
| 6,171,883 | B1 |   | 1/2001  | Fan et al.          |
| 6,188,094 | B1 | * | 2/2001  | Kochi et al. ... 257/232 |
| 6,221,687 | B1 | * | 4/2001  | Abramovich ... 438/70 |
| 6,255,640 | B1 | * | 7/2001  | Endo et al. ... 250/208.1 |
| 6,291,811 | B1 | * | 9/2001  | Ogawa ... 250/208.1 |
| 6,344,369 | B1 | * | 2/2002  | Huang et al. ... 438/70 |
| 6,417,022 | B1 |   | 7/2002  | Hsiao et al.        |
| 6,582,988 | B1 | * | 6/2003  | Hsiao et al. ... 438/70 |
| 6,803,250 | B1 |   | 10/2004 | Yaung et al.        |
| 6,970,212 | B1 | * | 11/2005 | Gomi ... 349/95 |
| 2001/0010952 | A1 |  | 8/2001 | Abramovich          |
| 2005/0045927 | A1 | * | 3/2005 | Li ... 257/294 |
| 2005/0061950 | A1 | * | 3/2005 | Jiang et al. ... 250/208.1 |
| 2005/0101043 | A1 | * | 5/2005 | Chen et al. ... 438/30 |

FOREIGN PATENT DOCUMENTS

TW          1223105          12/2003

OTHER PUBLICATIONS

Quirk et al., Semiconductor Manufacturing Technology, Prentice Hall, 1st Ed., 2001, pp. 279-283.*

(Continued)

*Primary Examiner*—Chandra Chaudhari
(74) *Attorney, Agent, or Firm*—Thomas, Kayden, Horstemeyer & Risley

(57) ABSTRACT

A semiconductor device including a semiconductor substrate having a photosensor formed therein; a first layer overlying the substrate, the first layer includes a portion having a generally concave shaped surface being the negative shaped of a micro-lens to be formed there over; a second layer overlying the first layer, the second layer including a generally convex shaped portion vertically aligned with and mating with the generally concave shaped surface, the generally convex shaped portion being constructed and arranged to define a micro-lens positioned to cause parallel light passing through the micro-lens to converge on and strike the photosensor.

20 Claims, 6 Drawing Sheets

OTHER PUBLICATIONS

Definition of the word "crest", [online], [retrieved on Aug. 1, 2007] retrieved from the internet: <URL: http://mw1.merriam-webster.com/dictionary/crest>.*
TW Office Action mailed Jan. 11, 2007.
TW Office Action mailed Mar. 31, 2007.
CN Office Action mailed Dec. 7, 2007.
CN Office Action mailed Jun. 27, 2008.
English abstract of TW 1223105.

* cited by examiner

SEMICONDUCTOR DEVICE WITH MICRO-LENS AND METHOD OF MAKING THE SAME

FIELD OF THE INVENTION

This invention relates to semiconductor devices, and in particular to semiconductor devices including a micro-lens, and methods of making the same.

BACKGROUND OF THE INVENTION

In advanced image sensor devices, a micro-lens is usually used to collect and focus light on a sensor. However, typical prior micro-lenses have a number of disadvantages. The overall height from the silicon surface of the semiconductor to the top layer, formed by a color filter process, is typically very large. This large height or distance might decrease the function of the micro-lens. Some micro-lenses are made from a positive photoresist. However, this positive photoresist has reliability issues in that the photoresist materials may yellow and are not capable of resisting high temperatures.

FIG. 1 illustrates a sectional view of a prior art semiconductor device 10 including a micro-lens 12. The semiconductor device includes a silicon-based substrate 30 in which a sensor 28 is formed such as a photodiode. An inter-metal dielectric layer 26, such as silicon dioxide, is provided over the silicon-based substrate 30. A silicon dioxide passivation layer 24 is provided over the inter-metal dielectric layer 26. A silicon nitride layer 22 is provided over the silicon dioxide passivation layer 24 and a planarization layer 20 is provided over the silicon nitride layer 22. A color filter layer 18 is provided over the planarization layer 20 and a micro-spacer 16 is provided over the color filter layer 18. The micro-lens 12 is formed over the color filter layer 18. The micro-lens 12 includes a convex shaped upper surface 14 which causes parallel light rays 2 to converge on and strike the sensor 28.

Abramovich, United States Patent Application Publication No. 2001/0010952A1, published Aug. 2, 2001, discloses a method of producing a color CMOS image sensor. Disclosed is a color image sensor that is formed on an n-type semiconductor substrate, having a p-well layer. An array of photodiodes and charged transfer regions are formed in a p-well layer, and are covered by silicon oxide or nitride film. A poly-silicon electrode is located over charged transfer regions such that it is surrounded by film. A photo-shielding metal layer is formed over the electrode, and a surface protective coating and a passivation layer are formed over the metal layer. The color filter layer is formed on the passivation layer, and an intermediate transfer film is formed over the color filter layer. A micro-lens for focusing light beams is formed from silicon dioxide or a resin material on intermediate transparent film. In the operation, light beams are focused by the micro-lens through the color filter layer such that they converge on the focal axis of the micro-lens to strike the photodiode, wherein photo energy from the light beams frees electrons in the photodiode. When a select voltage is applied to the poly-silicon electrode, these freed electrons generate a current in the charge transfer region. A sensor circuit associated with a color sensor then determines the amount of light received by the photodiode by measuring the amount of current generated in the charge transfer region. A dielectric layer may be provided and is etched to form the micro-lens. This may be accomplished using reactive-ion etching. The etching process is controlled such that a portion of the dielectric layer remains over the passivation layer. A silicon nitride layer may also be deposited and etched to form a micro-lens. Disclosed also is the process of depositing a photoresist portion and subsequently etching the photoresist layer to form a micro-lens.

Hsiao, et al., U.S. Pat. No. 6,417,022, issued Jul. 9, 2002, discloses a process of forming a multiplicity of micro-lenses for the color filters. A photodiode is first formed in the surface of a substrate, which also includes a series of metal connectors covered by a layer of passivation that forms an irregular upper surface. The irregular upper surface is then planarized to deposit a layer of dielectric material over the passivation layer. After the planarization step has been performed, a subsequent step is carried out to form a color filter layer providing red, green and blue color elements. As a final step, a micro-lens spacer is applied and followed by a step, which produces a micro-lens. Disclosed is a method in which a micro-lens material is patterned into at least three separate embryos performing three separate micro-lenses of long focal length. Each of the micro-lens embryos may be divided into nine discreet regions of different sizes. After the embryos are patterned by standard photolithographic methods, the embryos are reflown in a reflow process at a temperature of about 160 degrees Celsius, forming a micro-lens.

Hsaio, et al., U.S. Pat. No. 6,582,988, issued Jun. 24, 2003, discloses a method of making a micro-lens including providing a silicon substrate having a plurality of CMOS devices. A non-photosensitive planarization layer is deposited over the substrate. A color filter layer is placed over the top of the planarization layer with individual red/green/blue (RGB) sub-section pixel areas. A negative type photo-resistant material is utilized for the planarization/passivation layer formed directly over the color filter layer. One material disclosed as suitable for that application is a novolac/acrylic matrix supplied as CT-3050L by Fuji-Olin Corporation. A positive type photo-sensitive material is applied over the planarization/passivation layer. One embodiment disclosed as suitable for the positive type photo-sensitive material is a mixture of melamine resin and generic novolac based resin. Thereafter, a plasma etch step is utilized with oxygen plasma to etch through exposed regions of the planarization layer to define the micro-lens array. After the plasma etch step, the micro-lens array undergoes a hard bake reflow operation to produce the micro-lens.

The present invention provides alternatives to the prior art.

SUMMARY OF THE INVENTION

One embodiment of the invention includes a method of making a semiconductor device comprising a micro-lens comprising:

providing a semiconductor device comprising a substrate having a plurality of sensors formed therein;

forming a first protrusion containing layer on the semiconductor device, wherein the first protrusion containing layer comprises spaced apart protrusion portions;

forming a first layer over the first protrusion containing layer so that the first layer comprises spaced apart crest portions aligned with the protrusion portions of the first protrusion containing layer, and wherein a concave shaped surface is provided between spaced apart crest portions of the first layer;

forming a second layer over the first layer, and wherein the second layer comprises spaced apart convex shaped portions, each convex shaped portion aligned with and mating with one of the convex shaped surfaces of the first layer.

Another embodiment of the invention includes a method of forming a semiconductor device comprising a micro-lens comprising:
  forming a top metallization layer, comprising a plurality of spaced apart protrusions, over a semiconductor device comprising a plurality of sensors formed in a silicon based substrate;
  forming a first layer over the top metallization layer comprising high density plasma silicon oxide deposition, wherein the first layer comprises concave shaped surface portions;
  forming a second layer over the first layer comprising plasma enhanced chemical vapor silicon nitride deposition;
  chemical mechanical planarizing the second layer; wherein the second layer comprises convex-shaped portions each defining a micro-lens; forming a color filter over the planarized second layer;
  forming a color filter over the planarized second layer.

Another embodiment of the invention includes a method of making a semiconductor device comprising:
  forming a first pre-protrusion containing layer over a semiconductor device comprising a plurality of sensors formed in a silicon-based substrate, the forming of the first layer comprising high density plasma chemical vapor silicon oxide deposition;
  etching portions of the first pre-protrusion containing layer to form a first protrusion containing layer comprising spaced apart protrusion portions;
  depositing a first layer over the first protrusion containing layer comprising high-density plasma chemical vapor oxide deposition so that the first layer comprises spaced apart crest portions and a concave shaped portion extended between adjacent spaced apart crest portions;
  depositing a second layer over the first layer, the depositing of a second layer comprising plasma enhanced chemical vapor silicon nitride deposition;
  chemical mechanical planarizing the second layer, wherein the second layer comprises a convex-shaped portion aligned with the concave-shaped portion; forming a color filter over the planarized second layer.

Another embodiment of the invention includes a semiconductor device comprising:
  a semiconductor substrate comprising a photosensor forming therein; a first layer overlying the substrate, the first layer comprising a portion comprising a generally concave shaped surface being the negative shaped of a micro-lens to be formed there over;
  a second layer overlying the first layer, the second layer comprising a generally convex shaped portion vertically aligned with and mating with the generally concave shaped surface, the generally convex shaped portion being constructed and arranged to define a micro-lens positioned to cause parallel light passing through the micro-lens to converge on and strike the photo sensor.

These and other embodiments of the present invention will become apparent from the following brief description of the drawings, detailed description of exemplary embodiments, and appended claims and drawings.

DETAILED DESCRIPTION OF EXEMPLARY EMBODIMENTS

Figure 1:
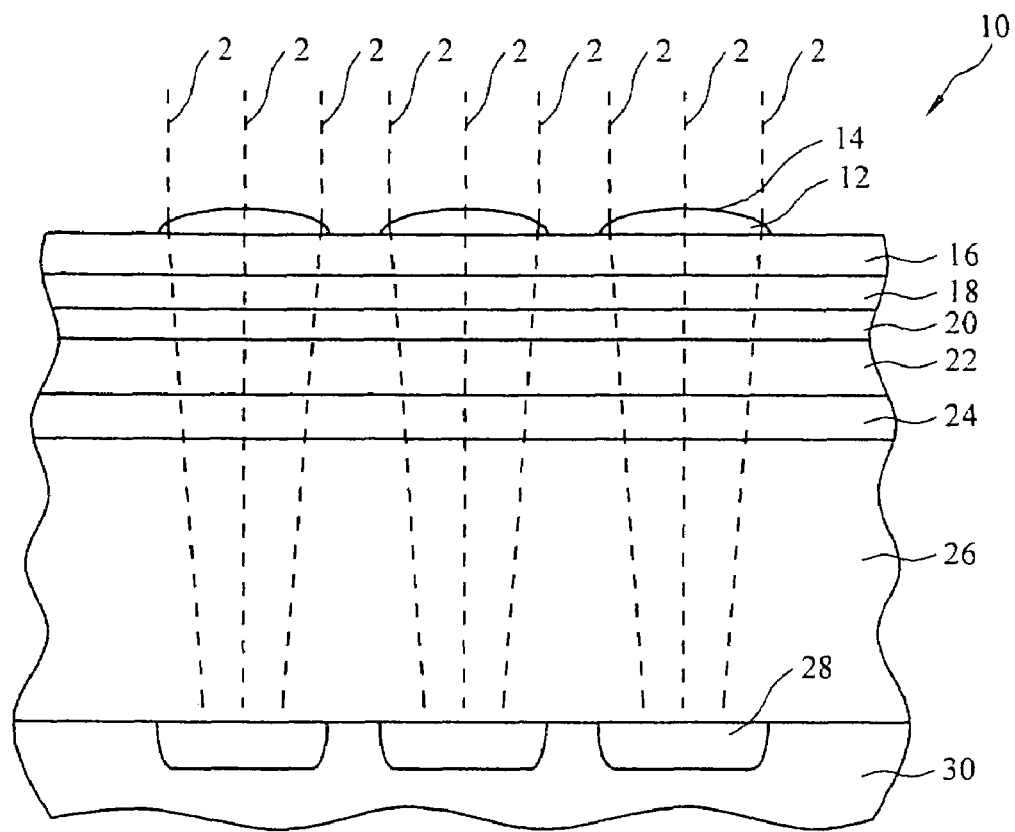
FIG. 1 illustrates a prior art semiconductor device including a micro-lens.
Figure 2A:
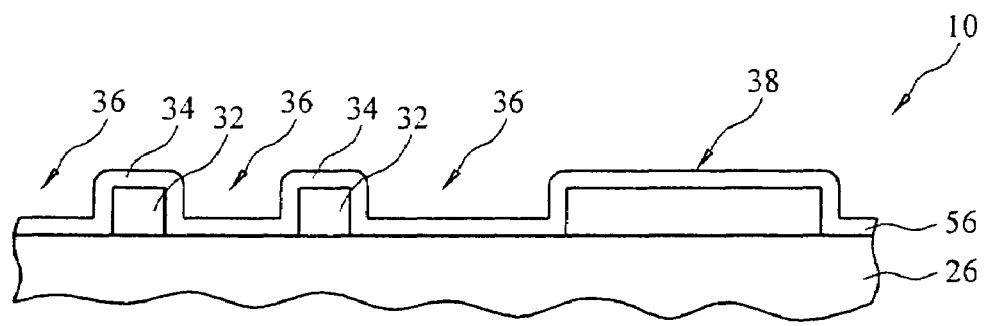
FIG. 2A illustrates a method according to one embodiment of the present invention including providing a first protrusion containing layer over a substrate, wherein the first protrusion containing layer includes a plurality of protrusion portions.

Referring now to FIG. 2A, one embodiment of the present invention includes a method including providing a semiconductor device 10 which includes at least one inter-metal dielectric layer 26 onto which a first protrusion containing layer 32 is formed. The first layer 32 includes a plurality of spaced apart protrusion portions 34, each protrusion portion 34 including a summit. In one embodiment, the first protrusion containing layer 32 may include a top metallization layer which may comprise a metal such as, but not limited to, aluminum or copper and alloys thereof. A trough 36 may be provided between two of the spaced apart protrusion portions 34. In one embodiment the trough 36 is provided by an opening extending all the way down to the inter-metal dielectric layer 26. The first protrusion containing layer 32 may also include other structures such as a bond pad 38. As will be appreciated from FIG. 2A, alternatively, an additional passivation layer 56 may be formed over the first protrusion containing layer 32. The passivation layer 56 may include silicon dioxide.

Figure 2B:
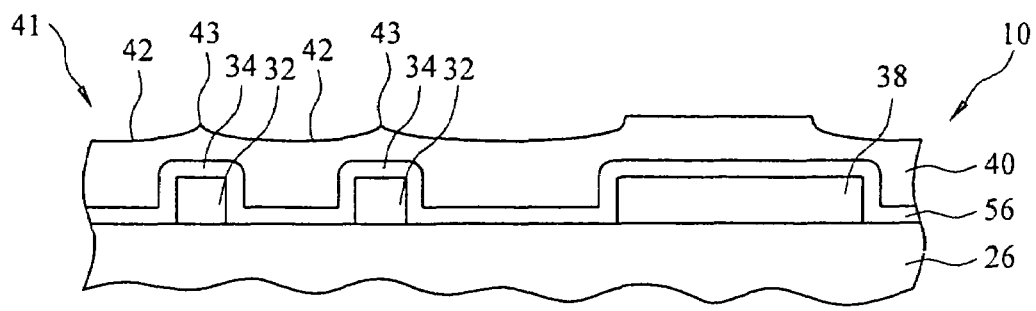
FIG. 2B illustrates a method according to one embodiment of the present invention including providing a first layer over the first protrusion containing layer of FIG. 2A, wherein the first layer includes a plurality of concave shaped portions.

Referring now to FIG. 2B, one embodiment of the present invention includes a method of forming a first layer 40 over the first protrusion containing layer 32. The first layer 40 also includes crest (or summit) portions 43 which are vertically aligned with the protrusion portions 34 of the first protrusion containing layer 32. A trough 41 is formed between spaced apart adjacent crest portions 43 of the first layer 40. The first layer 40 includes a concave shaped surface 42 extending between spaced apart adjacent protrusion portions 43. In one embodiment, the first layer 40 may comprise a dielectric such as silicon dioxide. In one embodiment, the first layer 40 comprises silicon dioxide deposited by high-density plasma oxide chemical vapor deposition.

Figure 2C:
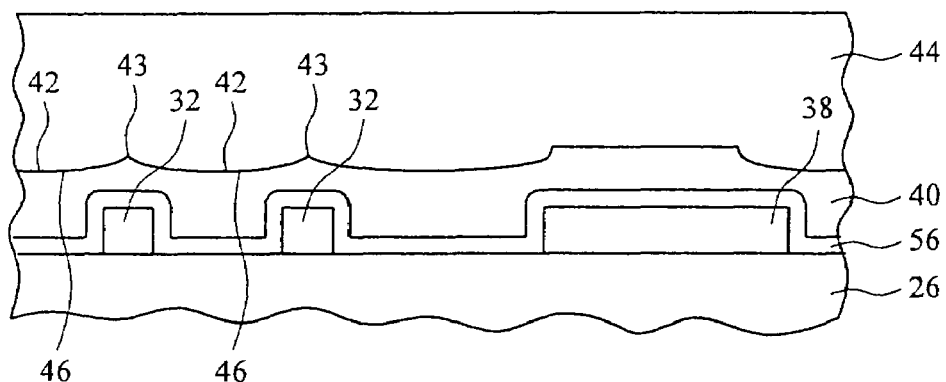
FIG. 2C illustrates a method according to one embodiment of the present invention including providing a second layer over the first layer of FIG. 2B, wherein the second layer includes a plurality of convex shaped portions, each convex shaped portion aligned with one of the concave shaped portions of the first layer.

Referring now to FIG. 2C, in one embodiment of the invention a second layer 44 is formed over the first layer 40. The second layer 44 includes convex shaped portion 46 aligned and mated with the concave shaped surface 42 of the first layer 40. After the second layer 44 has been deposited, the second layer 44 may be planarized, for example using chemical mechanical planarization. In one embodiment, the second layer may be silicon nitride and may be deposited by a variety of methods including plasma enhanced chemical vapor nitride deposition. The semiconductor device 10 may be etched to form an opening down to the bottom pad 38, if present.

Figure 2D:
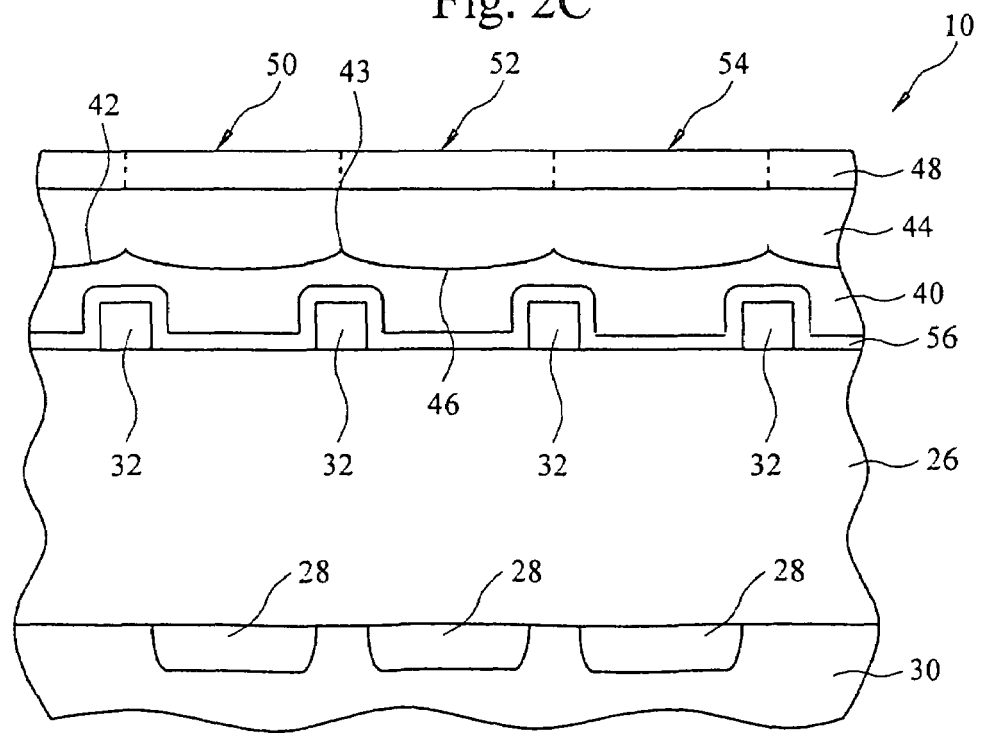
FIG. 2D illustrates a method according to one embodiment of the present invention including providing a third layer over the planarized second layer of FIG. 2C, wherein the third layer includes color filter portions, each colored filter portion aligned with a sensor formed in the substrate.

Referring now to FIG. 2D, another embodiment for the invention includes providing a color filter layer 48 over the second layer 44. The color filter layer 48 may include individual color sections such as a red filter, green filter, and blue filter 50, 52, and 54. Each color filter section 50, 52, and 54 is aligned with one of the sensors 28 formed in the silicon- based substrate 30.

Figure 2E:
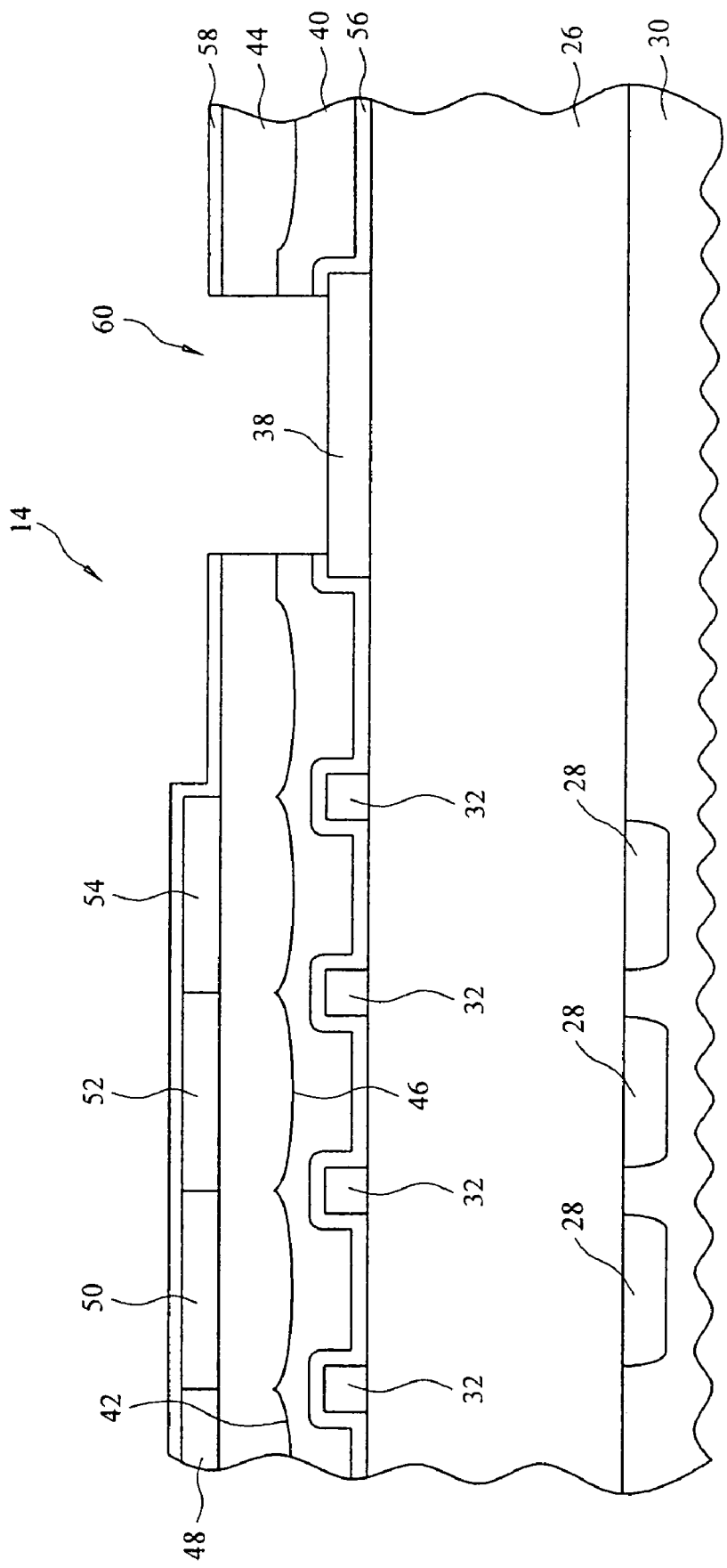
FIG. 2E illustrates a method according to one embodiment of the present invention including applying an oxide layer over the third layer and etching down to a contact pad on the semiconductor device.

As shown in FIG. 2E, one embodiment of the invention includes providing an upper passivation layer 58 such as that provide by low temperature silicon dioxide deposition process, and etching away portions of the semiconductor device 10 to provide an opening 60 down to the bottom pad 38. It will be appreciated from FIGS. 2C-E, that the convex shaped portion 46 of the second layer of 44 provides a micro-lens that will cause parallel light rays passing through one of the color filter sections 50, 52, 54, and through the convex shaped portion 46 to converge on and strike one of the sensors 28 formed in the silicon-based substrate 30. In one embodiment of the invention, the use of a second layer 44 including silicon nitride produces a a micro-lens which is not subject to the yellowing problem that prior art micro-lenses made from different materials such as photoresist materials are subject to.

Figure 3:
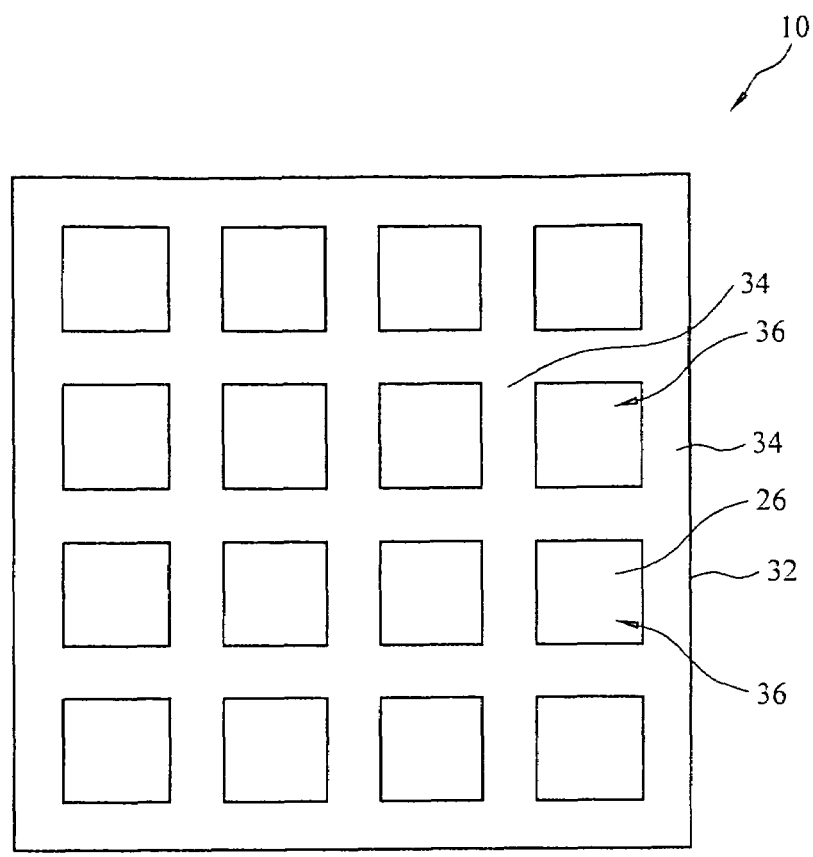
FIG. 3 is a plan view showing the pattern of the first protrusion containing layer overlying the substrate according to one embodiment of the present invention.

FIG. 3 is a plan view of a portion of a semiconductor device 10 according to the present invention illustrating the pattern of the first protrusion containing layer 32 including a plurality of spaced apart protrusion portions 34 separated by a trough portion 36.

Figure 4A:
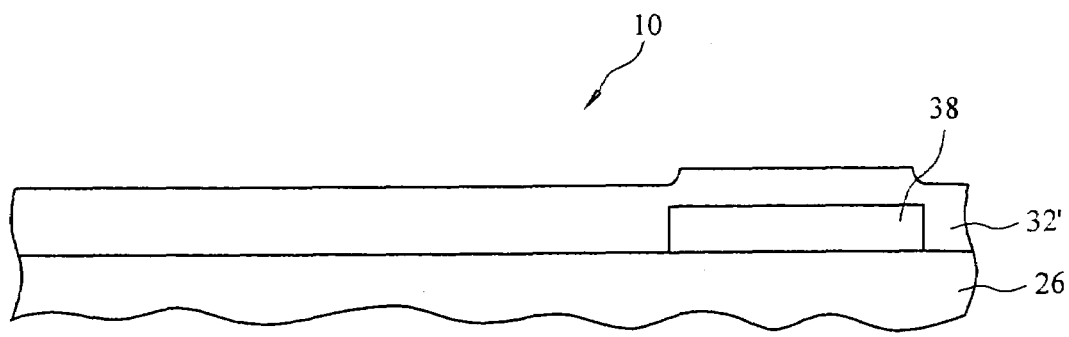
FIG. 4A illustrates a method according to one embodiment of the invention including providing a pre-protrusion containing layer over a substrate.

FIGS. 4A-E illustrates an alternative embodiment that does not require a top metallization layer to include spaced apart protrusion portions. Referring now to FIG. 4A, in one embodiment of the invention, a semiconductor device 10 is formed wherein a first pre-protrusion containing layer 32' is provided over an inter-metal dielectric layer 26, and over a bond pad 38, if present. However, in this case the first pre-protrusion containing layer 32' may include silicon dioxide that may be deposited, for example by high-density plasma chemical vapor oxide deposition.

Figure 4B:
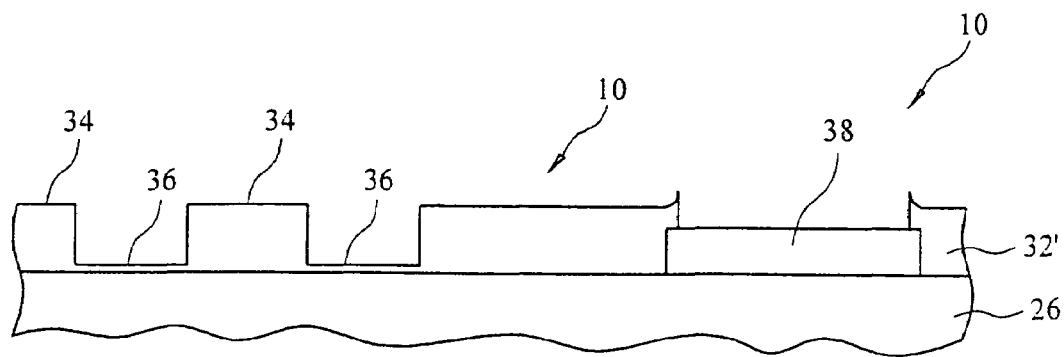
FIG. 4B illustrates a method according to one embodiment of the present invention including forming protrusion and trough portions in the pre-protrusion containing layer of FIG. 4A to provide a first protrusion containing layer.

Referring now to FIG. 4B, a plurality of spaced apart trough portions 36 are formed in the first pre-protrusion containing layer 32', for example using photolithographic and etching techniques known to those skilled in the art. The resulting first protrusion containing layer 32 includes spaced apart protrusion portions 34.

Figure 4C:
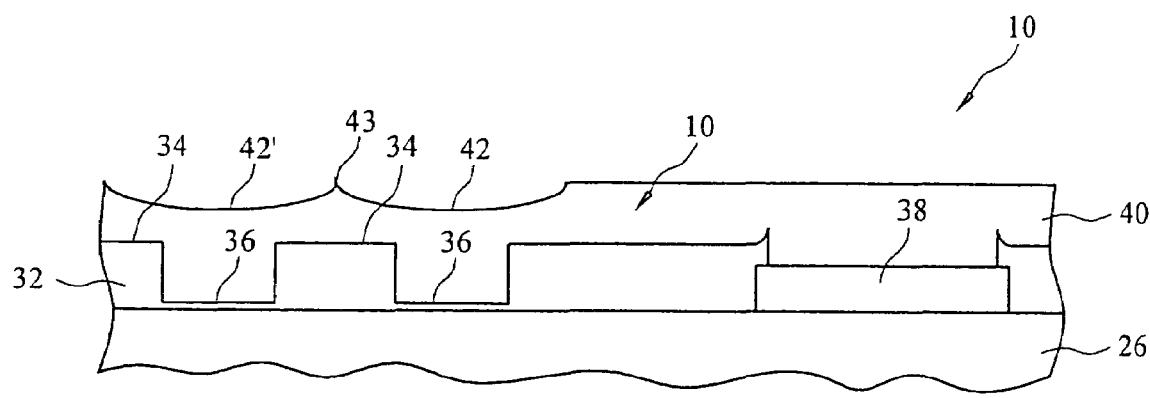
FIG. 4C illustrates a method according to one embodiment of the invention including providing a first layer over the first protrusion containing layer of FIG. 4B, and wherein the first layer includes a plurality of concave shaped portions, each concave shaped portion extending between adjacent spaced apart protrusion portions of the first protrusion containing layer.

Referring now to FIG. 4C, a first layer 40 may be deposited over the first protrusion containing layer 32 so that the first layer 40 includes spaced apart crest portions 43 each aligned with one of the protrusion portions 34 of the first protrusion containing layer 32. In one embodiment, the first layer 40 includes silicon dioxide that may be deposited by any of a variety of methods including high-density plasma chemical vapor oxide deposition. As will be appreciated from FIG. 4C, the first layer 40 includes a concave shaped portion 42 extending between spaced apart adjacent crest portions 43.

Figure 4D:
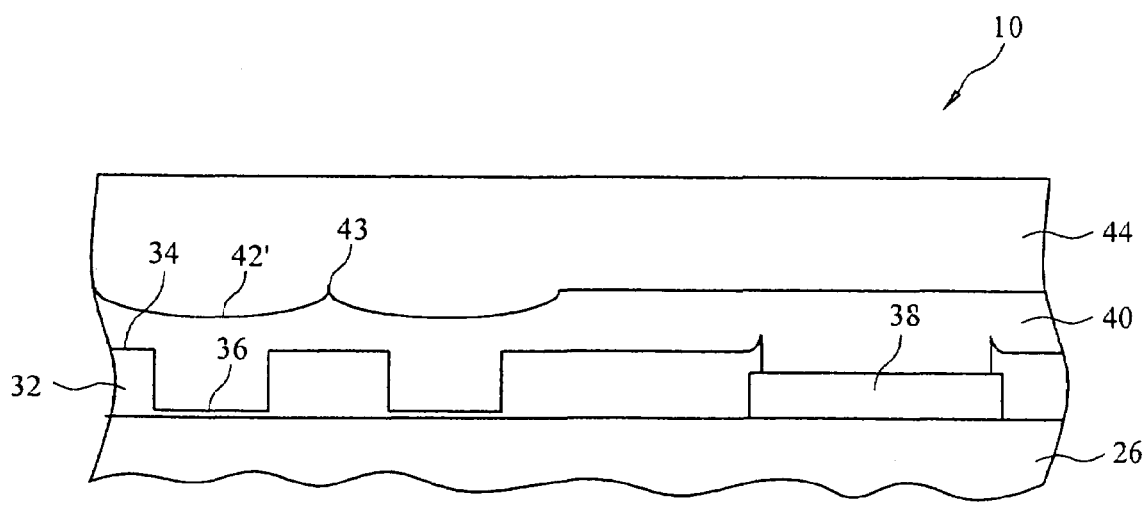
FIG. 4D illustrates a method according to one embodiment of the invention including providing a second layer over the first layer and wherein the second layer includes a plurality of convex shaped portions, each convex shaped portion aligned with a concave shaped portion of the first layer.
Figure 4E:
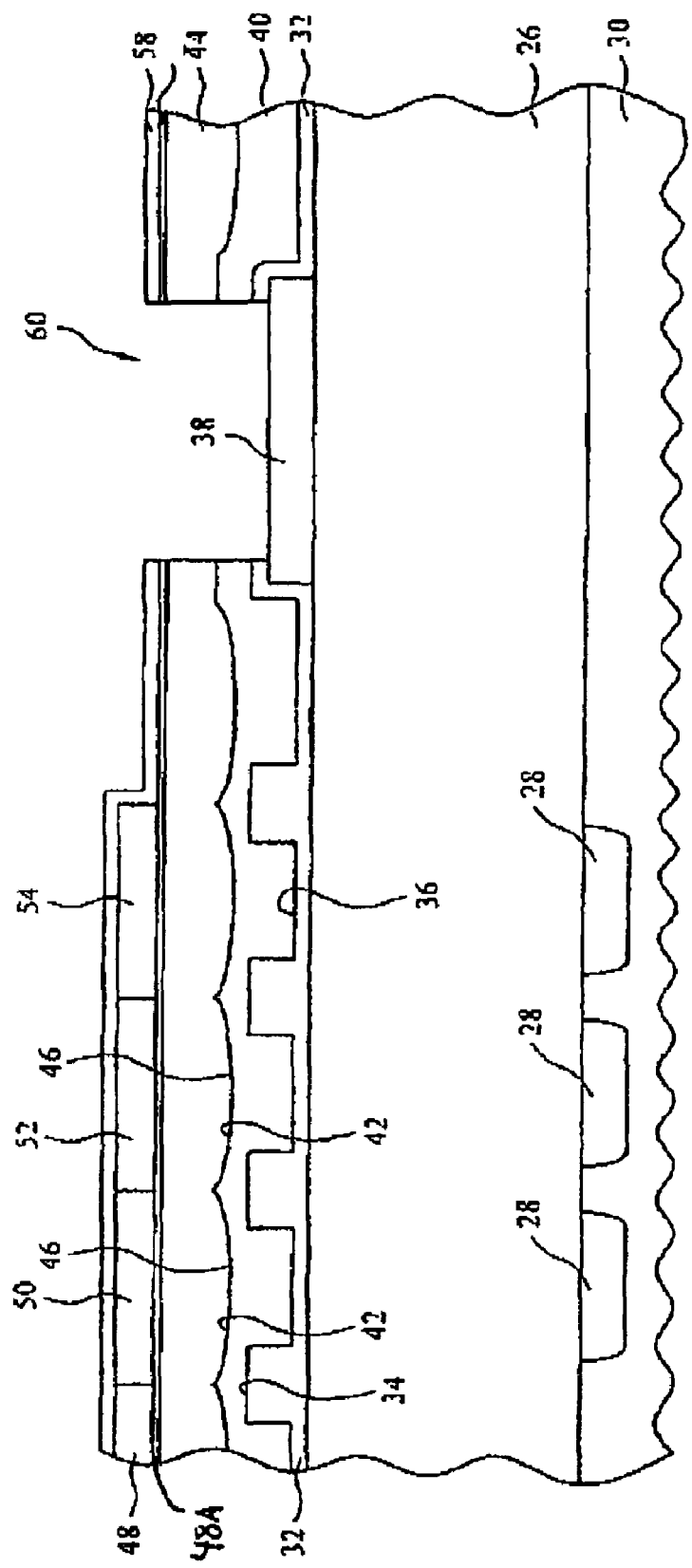
FIG. 4E illustrates a method according to one embodiment present invention including providing a third layer over the planarized second layer of FIG. 4D, wherein the third layer includes color filter portions, each color filter portion aligned with a sensor formed in the substrate.

Referring now to FIG. 4D, in one embodiment of the invention, a second layer 44 may be deposited over the first layer 40 and thereafter may be planarized by, for example, chemical mechanical planarization. In one embodiment, the second layer 44 may include silicon nitride, and may be deposited by any of a variety of methods including plasma enhanced chemical vapor silicon nitride deposition. As shown in FIG. 4D, it will be appreciated that the second layer 44 includes convex shaped portions 46 aligned with and mated with the concave shaped portions 42 of the first layer 40. The semiconductor 10 may be etched to form an opening 60 down to the bottom pad 38 if present.

Referring now to FIG. 4E, again, a color filter layer 48 may be deposited with an adhesion layer 48A over the planarized second layer 44 and the color filter layer 48 may include individual color filter segments 50, 52, 54 corresponding to a red filter, green filter, and blue filter respectively. Thereafter, a top layer 58 may be deposited over the color filter layer 48. The top layer 58 may include low temperature silicon oxide, and the semiconductor device 10 may be etched to form an opening 60 down to the bond pad 38, if present.

When the terms "overlying", "overlie", "over" and the like terms are used herein regarding the position of one component of the invention with respect to another component of the invention, such shall mean that the first component may be in direct contact with the second component or that additional components such as under bump metallurgies, seed layers and the like may be interposed between the first component and the second component.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A method of making a semiconductor device comprising a micro-lens comprising:
providing a semiconductor device comprising a substrate having a plurality of sensors formed therein;
forming a first protrusion containing layer comprising spaced apart protrusion portions on the semiconductor device;
blanketly forming a first layer comprising spaced apart crest portions aligned with the protrusion portions of the first protrusion containing layer over the first protrusion containing layer wherein the first layer fully fills a recess between the spaced apart protrusion portions, and said first layer comprises a concave shaped surface extending between said spaced apart crest portions;
forming a second layer over the first layer, wherein the second layer comprises spaced apart convex shaped portions, each convex shaped portion aligned with and mating with one of the convex shaped surfaces of the first layer.

2. A method as set forth in claim 1 wherein the second layer comprises silicon nitride.

3. A method as set forth in claim 1 further comprising planarizing the second layer.

4. A method as set forth in claim 3 further comprising depositing a color filter over the second layer after the planarizing.

5. A method as said forth in claim 4 for further comprising depositing an adhesion layer over the planarized second layer prior to forming the color filter.

6. A method as set forth in claim 1 wherein the first protrusion containing layer comprises a top metallization layer comprising spaced apart protrusion portions.

7. A method as set forth in claim 4 wherein the color filter layer comprises individual color segments, wherein each of the color segments is aligned with one of the convex shaped portions of the second layer.

8. A method as set forth in claim 1 wherein each of the convex shaped portions of the second layer is aligned with one of the sensors formed in the semiconductor substrate.

9. A method as set forth in claim 1 wherein the first layer comprises silicon dioxide.

10. A method as set forth in claim 1 wherein the forming of the first layer comprises high density plasma chemical vapor oxide deposition.

11. A method as set forth in claim 1 wherein the forming of the second layer comprises plasma enhanced chemical vapor silicon nitride deposition.

12. A method as set forth in claim 1 wherein the planarizing comprises chemical mechanical planarization.

13. A method as set forth in claim 1 wherein the first protrusion containing layer is formed over a top metallization layer comprising a plurality of spaced apart protrusion portions.

14. A method as set forth in claim 1 further comprising forming the spaced apart protrusion portions in the first protrusion containing layer comprising depositing a first pre-protrusion containing layer comprising a substantially planar upper surface and etching portions of the first layer to provide the spaced apart protrusion portions therein to provide the first protrusion containing layer.

15. A method as set forth in claim 1 wherein the convex shaped portions of the second layer form a micro-lens for converging parallel light rays passing through the second layer onto one of the sensors formed in the silicon-based substrate.

16. A method of forming a semiconductor device comprising a micro-lens comprising:
   forming a top metallization layer, comprising a plurality of spaced apart protrusions, over a semiconductor device comprising a plurality of sensors formed in a silicon based substrate;
   forming a first layer over the top metallization layer comprising high density plasma silicon oxide deposition, wherein the first layer comprises concave shaped surface portions;
   forming a second layer over the first layer comprising plasma enhanced chemical vapor silicon nitride deposition, wherein the second layer comprises convex shaped portions each of said convex shaped portions mating with one said concave portions, each of said convex shaped portions defining a micro-lens;
   chemical mechanical planarizing the second layer; forming a color filter over the second layer, wherein the planarizing second layer extends to cover the protrusion of the top metalization layer.

17. A method as set forth in claim 16 further comprising forming a dielectric layer over the top metallization layer prior to forming the first layer.

18. A method as said forth in claim 16 further comprising etching the second layer and the first layer to form an opening down to the bottom pad with the passivation mask prior to forming the color filter.

19. A method as said forth in claim 16 further comprising depositing an adhesion layer over the planarized second layer prior to forming the color filter.

20. A method as said forth in claim 16 wherein two adjacent convex shaped portions of the second layer are connected.

* * * * *